(12) United States Patent
Kim et al.

(10) Patent No.: US 8,952,837 B2
(45) Date of Patent: Feb. 10, 2015

(54) MULTI-RATE SIGMA DELTA DIGITAL-TO-ANALOG CONVERTER

(71) Applicant: Broadcom Corporation, Irvine, CA (US)

(72) Inventors: Min Gyu Kim, Irvine, CA (US); Dongtian Lu, Irvine, CA (US); Todd L. Brooks, Laguna Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/019,246

(22) Filed: Sep. 5, 2013

(65) Prior Publication Data

US 2014/0240154 A1 Aug. 28, 2014

Related U.S. Application Data

(60) Provisional application No. 61/770,903, filed on Feb. 28, 2013, provisional application No. 61/809,728, filed on Apr. 8, 2013.

(51) Int. Cl.
  *H03M 3/02* (2006.01)
  *H03M 3/00* (2006.01)
(52) U.S. Cl.
  CPC ............... *H03M 3/414* (2013.01); *H03M 3/32* (2013.01)
  USPC ...................................................... 341/143

(58) Field of Classification Search
  CPC ..... H03M 3/414; H03M 3/416; H03M 3/418; H03M 3/42; H03M 3/436
  USPC ......................................................... 341/143
  See application file for complete search history.

(56) References Cited

U.S. PATENT DOCUMENTS

| | | | | |
|---|---|---|---|---|
| 4,704,600 A | * | 11/1987 | Uchimura et al. | 341/122 |
| 4,876,543 A | * | 10/1989 | van Bavel | 341/143 |
| 5,061,928 A | * | 10/1991 | Karema et al. | 341/143 |
| 8,031,096 B2 | * | 10/2011 | Kinyua | 341/143 |
| 2009/0251346 A1 | * | 10/2009 | Kwan | 341/143 |
| 2010/0283649 A1 | * | 11/2010 | Bos et al. | 341/143 |

OTHER PUBLICATIONS

Bos et al., Multirate Cascaded Discrete-Time Low-Pass Delta-Sigma Modulator for GSM/Bluetooth/UMTS, IEEE Journal of Solid-State Circuits, vol. 45, No. 6, Jun. 2010.*

* cited by examiner

*Primary Examiner* — Howard Williams
(74) *Attorney, Agent, or Firm* — Brinks Gilson & Lione (57) ABSTRACT

A multi-rate sigma delta digital-to-analog converter may include a signal input and a signal output, and multiple modulators. A first of the modulator may convert a digital input signal on the signal input to an analog output signal on the signal output. Subsequent of the multiple modulators may shape and cancel quantization noise received from a proceeding modulator. One of the modulators may operate at a higher frequency than does another of the multiple modulation loops.

20 Claims, 6 Drawing Sheets

MULTI-RATE SIGMA DELTA DIGITAL-TO-ANALOG CONVERTER

CROSS REFERENCE TO RELATED APPLICATIONS

This application claims the benefit of priority to U.S. Provisional Application No. 61/770,903, filed Feb. 28, 2013, and to U.S. Provisional Application No. 61/809,728, filed Apr. 8, 2013, both of which are incorporated herein by this reference.

TECHNICAL FIELD

This disclosure relates to multi-loop digital-to-analog converters, and more particularly, to multi-rate sigma delta digital-to-analog converters.

BACKGROUND

Rapid advances in electronics and communications technologies, driven by consumer demand, have resulted in the widespread adoption of devices that employ digital-to-analog converters (DACs). These devices include wireless or mobile devices; headsets with loudspeakers; and other devices adapted to process audio signals, and are demanding increasing performance of analog signal conversion.

BRIEF DESCRIPTION OF THE DRAWINGS

The systems and methods may be better understood with reference to the following drawings and description. In the figures, like reference numerals designate corresponding parts throughout the different views.

DETAILED DESCRIPTION

Where the digital-to-analog converters (DACs) discussed above are employed in wireless or mobile devices, there is an increasing demand for better noise performance while also decreasing power consumption. For example, high-performance DAC designs seek low sensitivity to jitter and latch errors and low out-of-band noise power.

The discussion below makes reference to digital-to-analog converter, e.g., a multi-rate sigma delta digital-to-analog converter (MRSD-DAC) that includes two or more modulation loops, e.g., sigma delta loops, at least one of which operates at a different frequency than another of the sigma delta loops. In one example, the different frequency is a higher frequency. For example, a sigma delta modulator after the first sigma delta loop may be operated at a higher frequency to set quantization noise for the corresponding sigma delta loop at a higher frequency. Each subsequent sigma delta modulator after the first sigma delta modulator may also scale down generated quantization noise. The net result may be to reduce and push to higher frequencies the quantization noise that is not ultimately canceled in an analog output signal, thus also reducing the out-of-band (OOB) noise power.

Figure 1:
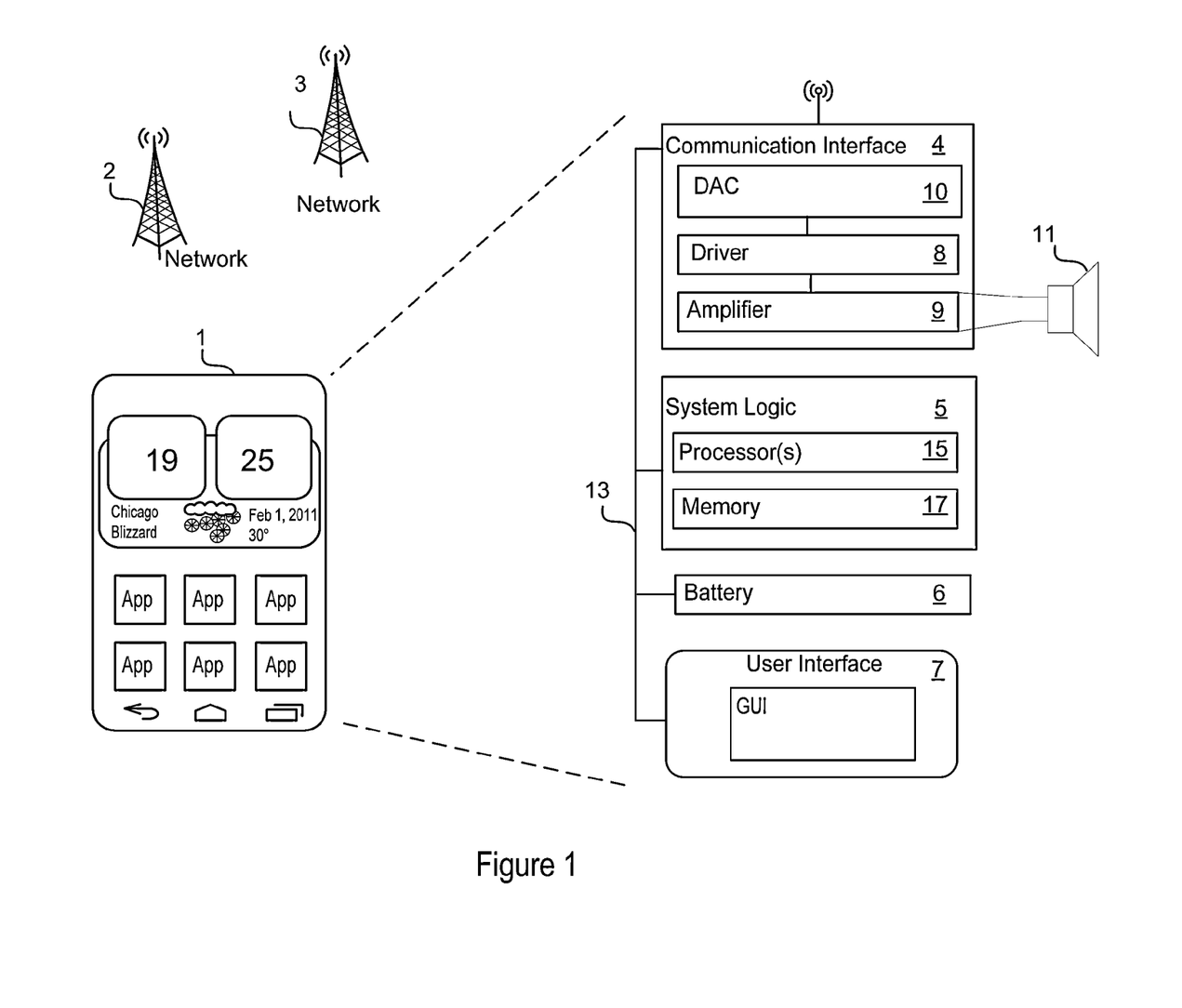
FIG. 1 is an example of user equipment.

FIG. 1 shows an example of user equipment (UE) 1 for use in mobile and wireless networks 2 and 3 or for multi-media use without wireless access to any network. User equipment may take different forms and have many different functions. As one example, user equipment may include a cellular phone capable of making and receiving wireless phone calls, including a smart phone that may also run other applications, including those that require an analog output. Alternatively, or additionally, the user equipment may include an MP3 player or other audio player or recorder. Alternatively, or additionally, the user equipment 1 may include a headset and loudspeaker adapted to receive an audio, digital input signal and convert the input signal to an audio analog output signal.

Wireless or mobile user equipment may be virtually any device that wirelessly connects to a network, including as additional examples a driver assistance module in a vehicle, an emergency transponder, a pager, a satellite television receiver, a networked stereo receiver, a computer system, music player, or virtually any other device. The discussion addresses how to improve performance of conversion of digital input signals to analog output signals.

The user equipment 1 may include a communication interface 4, system logic 5, a battery 6 and a user interface 7. All of these components and their subcomponents that will be discussed may connect to or communicate with each other through a bus 13.

The communication interface 4 may include one or more transceivers, a driver 8 and an amplifier 9. The transceivers may be wireless transceivers that include modulation/demodulation circuitry, amplifiers, phase locked loops (PLLs), clock generators, analog-to-digital converters (ADCs) and digital-to-analog converters (DACs) and/or other logic for transmitting and receiving through one or more antennas, or through a physical (e.g., wireline) medium. The transmitted and received signals may adhere to any of a diverse array of formats, protocols, modulations, frequency channels, bit rates, and encodings. As one specific example, the communication interface 4 may support transmission and reception under the Universal Mobile Telecommunications System (UMTS).

The communication interface 4 may also include a multi-loop sigma delta digital-to-analog converter (SD-DAC) 10. The SD-DAC 10 may convert a digital input signal to an analog output signal, which may be sent to a driver (DRV) 8, which may drive an amplifier (AMP) 9 to amplify the analog signal. Where the analog output signal is an audio signal, the amplifier 9 may send the amplified audio signal to a loudspeaker 11 for listening by a user. The digital input signal may be received from the memory 17 or from the communication interface 4, e.g., being streamed over one of the networks 2 or 3. The system logic 3 may indicate which digital signal is sent to the communication interface for conversion.

The system logic 3 may further include one or more processors 15, memory 17 and other logic required for operation. The system logic 5 may include any combination of hardware, software, firmware, or other logic. The system logic 5 may include software code responsible for radio protocols such as radio resource control (RRC) and non-access stratum (NAS). The system logic 5 may be implemented, for example, in a system on a chip (SoC), application specific integrated circuit (ASIC), or other circuitry. The system logic 5 is part of the implementation of desired functionality in the user equipment 1. In that regard, the system logic 5 may include logic that facilitates, as examples, running applications, accepting user inputs, saving and retrieving application data, establishing, maintaining, and terminating cellular phone calls, wireless network connections, Bluetooth connections, or other connections, and displaying relevant information on the user interface 7.

The user interface 7 may include a graphical user interface, touch sensitive display, voice or facial recognition inputs, buttons, switches, and other user interface elements. One goal of improving the SD-DAC 10 is to extend a life of a battery 6 by reducing power consumption as will be discussed. Furthermore, good jitter insensitivity is preferred for high performance analog output.

Figure 2:
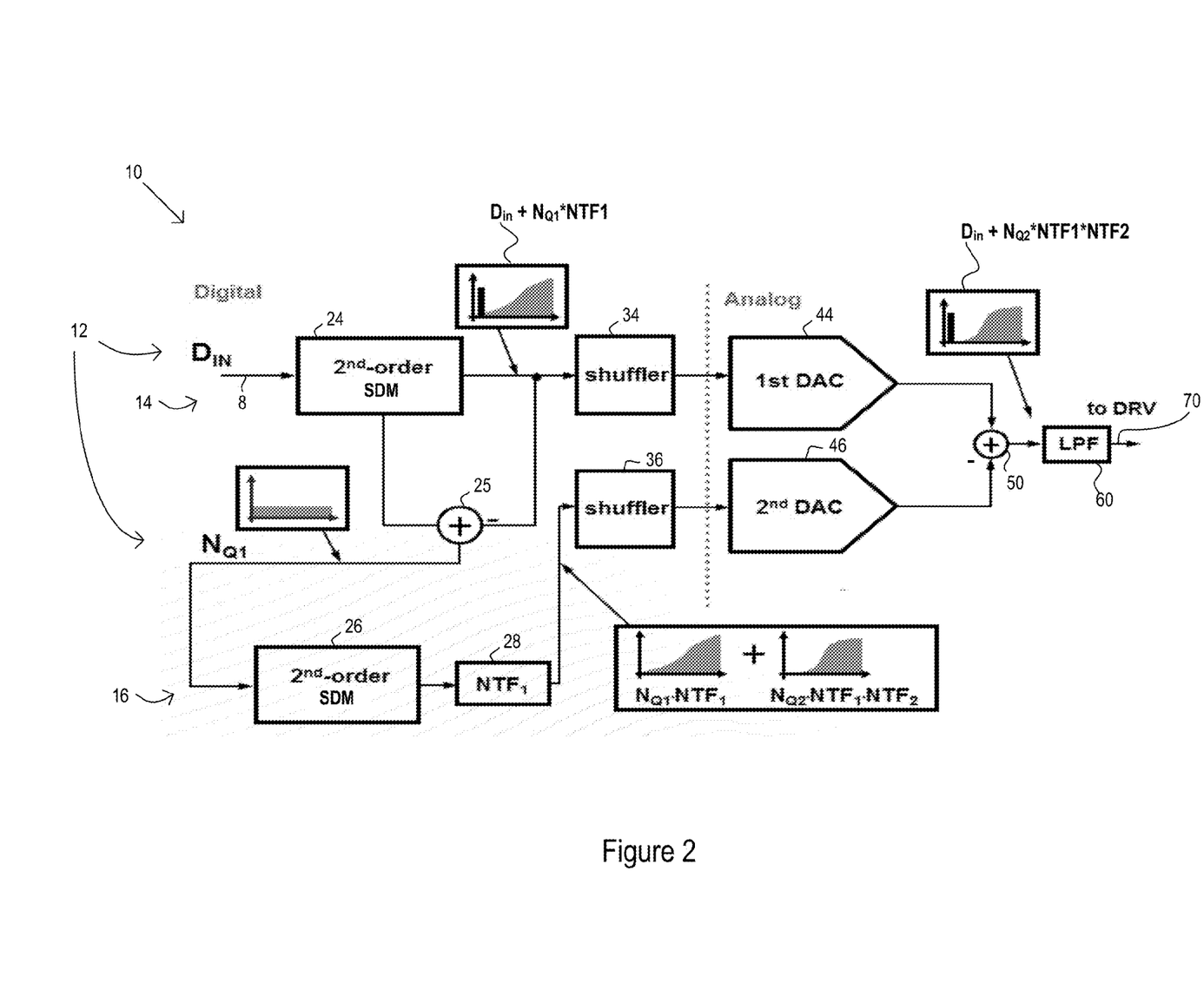
FIG. 2 is a block diagram of an example of a multi-loop sigma delta digital-to-analog converter (SD-DAC).

FIG. 2 is a block diagram of an example of a multi-loop sigma delta digital-to-analog converter (SD-DAC) 10. A multi-loop architecture (MASH) such as shown in FIG. 2 includes a signal input 8 and multiple digital signal paths 12 that act as modulation stages, which sample and modulate an incoming digital input signal (Din) and quantization noise. The SD-DAC 10 may include a first digital signal path 14 and a second digital signal path 16. The multi-loop SD-DAC 10 may also include a signal output 70. Each digital signal path 14 and 16 may include a sigma delta modulator ("SDM") 24 and 26, respectively, where the second SDM 26 may receive quantization noise from the first SDM 24. Quantization noise may include white noise generated from quantization errors when a high-resolution signal is converted to a low resolution digital signal.

Each sigma delta path 14 and 16 may also include a shuffler 34 and 36, respectively receiving the digital signal and quantization noise from the first and second SDMs 24 and 26. The shuffler 34 or 36 may include digital logic that dynamically modulates the elements of the digital-to-analog converter (DAC), to modulate noise components introduced due to DAC element mismatches out of the frequencies that SD-DAC generates. The shufflers 34 and 36 may be employed where the first DAC 44 and second DAC 46 are multi-bit DACs implemented with more than 1 (one) bit.

A filter 28 with an equivalent noise transfer function (NTF) may be positioned between the second SDM 26 and the second shuffler 36, operable to shape the quantization noise received from the first SDM 24. Each sigma delta modulator 14 and 16 may also include a DAC 44 and 46, respectively to convert the digital input signal and quantization noise to an analog output signal on the signal output 70. The multi-loop SD-DAC 10 may also include an analog subtractor 50 and an analog low pass filter (LPF) 60 to finish processing the analog output signal.

Sigma delta DACs may provide high dynamic range using low resolution DAC circuitry by interpolating and oversampling digital input signals and shaping quantization noise out of the frequency band of interest. Low bandwidth input signals are converted to a high rate with interpolation filters. High resolution digital signal paths are converted to low-resolution to support the use of low-resolution DAC circuitry with low cost and complexity. The spectral components of quantization errors introduced in the quantizer, which converts data from high resolution to low resolution, are shaped out of the band of interest. This occurs in the digital sigma-delta modulator (SDM) due to the use of feedback and filtering within the feedback loops, for example, in digital sigma-delta modulators SDM 24 and SDM 26. The out of band quantization noise may be filtered after the DAC using analog filters. The interpolation preceding the digital SDM increases the sample rate to the sampling frequency of the sigma delta modulator. Spectral components of the quantization error are spread out of the signal band of interest, between the signal band and $F_s/2$, where Fs is the sampling frequency of the sigma delta modulator.

Figure 4:
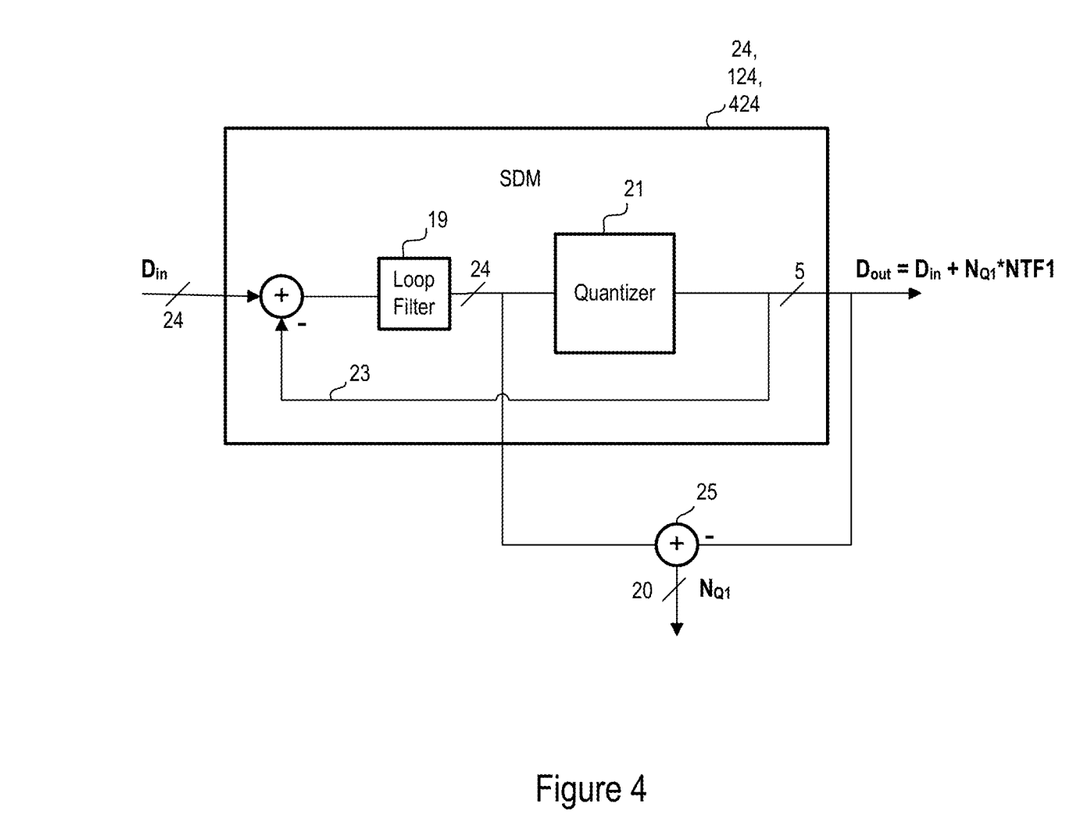
FIG. 4 is a block diagram showing the details of one of the sigma delta modulators of the MRSD-DAC of FIG. 3.

An example of the first SDM 24 is shown in FIG. 4. The first SDM 24 may include a loop filter 19 and a quantizer 21 arranged with a feedback loop 23 from an output of the SDM 24. The loop filter 19 may shape and filter the digital input signal and quantization noise created by the quantizer 21. The filter 19 may operate in the frequency domain having a transfer function of $1/(1-z^{-1})$ or the like, where the quantizer 21 may be modeled as a noise source in the frequency domain. The output of the digital SDM 24 includes a digital output signal ($D_{out}$) and the shaped first quantization noise ($N_{Q1}*NTF_1$) at a cutoff frequency of $F_s/2$. A copy of the first quantization noise ($N_{Q1}$) introduced by quantizer 21 may also be obtained with a subtractor 25 by subtracting the output of quantizer 21 from the input of quantizer 21, and $N_{Q1}$ may be sent to the second sigma delta path 14.

The design of FIG. 2 operates first and second SDMs 24 at 26 at the same low frequency. The $NTF_1$ filter 28 may shape the first quantization noise ($N_{Q1}$) received from the first SDM 24 and second quantization noise ($N_{Q2}$) generated by the second SDM 26. The $NTF_1$ filter 28 thus outputs the shaped first quantization noise ($N_{Q1}*NTF_1$) as well as the second quantization noise that is also shaped by a second noise transfer function ($NTF_2$) existing within the second SDM 26, e.g., $N_{Q2}*NTF_1*NTF_2$. The subtractor 50 may then subtract the output of the second sigma delta path from the output of the first sigma delta path after analog conversion, to cancel the shaped first quantization noise. This SD-DAC 10, however, will still output a significant amount of shaped quantization noise ($N_{Q2}*NTF_1*NTF_2$) due to the noise transfer functions ($NTF_1$ and $NTF_2$) still operating at the same lower frequency. The output analog signal on the signal output 70 may be sent to a driver (DRV) and ultimately to a load such as an amplifier, speaker or resistor.

While the SD-DAC 10 of FIG. 2 may improve in some respects in-band performance expected from a multi-loop sigma delta DAC, the SD-DAC 10 may result in excessive out-of-band (OOB) noise that may: (1) degrade the final analog in-band performance due to circuit nonlinearities that cause mixing of OOB noise to within the signal band of interest; and (2) increase analog hardware costs to achieve sufficient linearity to avoid degradation of the final analog in-band performance.

Figure 3:
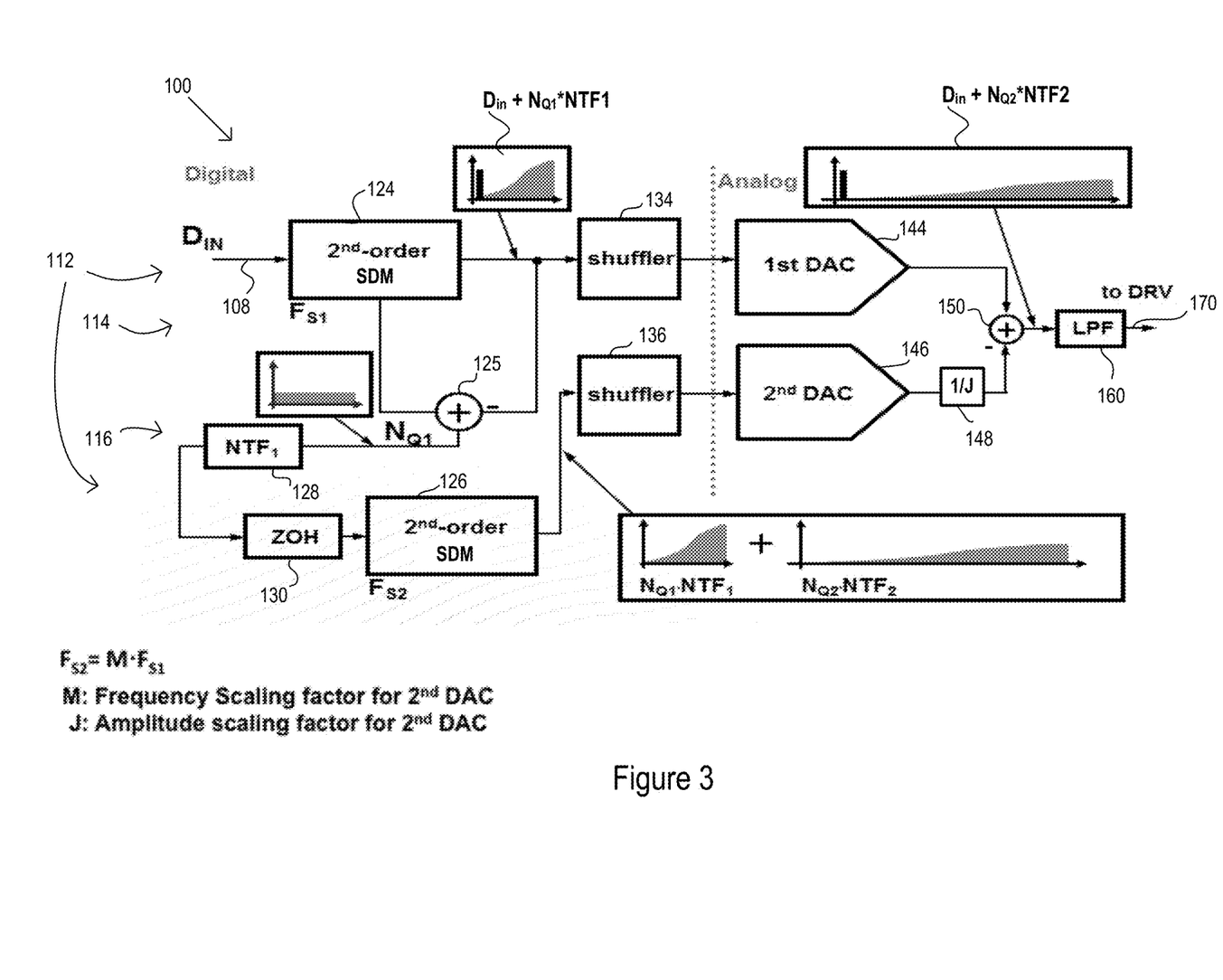
FIG. 3 is a block diagram of an example of a multi-rate sigma delta digital-to-analog converter (MRSD-DAC) having two sigma delta loops.

FIG. 3 is a block diagram of an example of a multi-rate sigma delta digital-to-analog converter (MRSD-DAC) 100 having two digital signal paths 112, a first digital signal path 114 and a second digital signal path 116. Similar to the SD-DAC 10 of FIG. 2, the sigma delta paths 114 and 116 in the MRSD-DAC 100 of FIG. 3 include respective sigma delta modulators (SDMs) 124 and 126, respective shufflers 134 and 136 and respective DACs 144 and 146. The MRSD-DAC 100 may further include a signal input 108, a subtractor 150, a low pass filter 160 and a signal output 170.

The MRSD-DAC 100 may also include a noise transfer function ($NTF_1$) filter 128, but in this case, the $NTF_1$ filter 128 may instead be located before the second SDM 126. This means that the second quantization noise ($N_{Q2}$) generated by the second SDM 126 will not also be shaped by the $NTF_1$ filter, allowing for a different profile of the shaped second quantization noise ($N_{Q2}*NTF_2$) being sent through the second DAC 146. As a consequence the out of band noise components from the second shaped quantization noise ($N_{Q2}*NTF_2$) are reduced.

The $NTF_1$ may shape the first quantization noise ($NQ_1$) and send the shaped first quantization noise ($N_{Q1}*NTF_1$) to a zero-order hold circuit (ZOH) 130 or other appropriate rate adaption filter. A ZOH may execute a mathematical model of the practical signal reconstruction performed by a DAC. That is, the ZOH performs basic interpolation of the digital signal to increase the data rate and support a higher frequency of operation for the signal path following ZOH 130.

Furthermore, the second SDM 126 may be operated at a second frequency ($F_{S2}$) higher than a first frequency ($F_{S1}$) at which the first SDM 124 is operated. In the example of FIG. 3, $F_{S2}$ is shown as M times greater than $F_{S1}$. At the output of the second DAC 146, a scalar 148 may scale the quantization noise from the second sigma delta path 116 by 1/J, where J, an amplitude scaling factor, is the amount by which the second DAC signal is attenuated with respect to the first DAC signal in accordance with a corresponding gain factor J that is applied within second SDM 126. The product of amplitude scaling factor J applied to the digital signal with second SDM 126 and amplitude scaling factor J applied again as attenuation (1/J) in scalar 148 to the analog signal at the output of the second DAC 146 results in unity scaling of the first shaped quantization noise ($N_{Q1}*NTF_1$).

The scalar 148 scales down the magnitude of second shaped quantization noise ($N_{Q2}*NTF_2$) when compared with the first shaped quantization noise ($N_{Q1}*NTF_1$), resulting in a reduction of the quantization noise at the output of subtractor 150 and at the signal output 170. The MRSD-DAC 100 may, therefore, provide for generating shaped first quantization noise ($N_{Q1}*NTF_1$) that can be canceled out by the subtractor 150 while also generating a reduction of high frequency components of the shaped second quantization noise ($N_{Q2}*NTF_2$) set at the higher (second) frequency. When the shaped second quantization noise is filtered through the LPF 160, the remaining out-of-band (OOB) noise power may be significantly reduced as seen by comparing the shaped second quantization noise ($N_{Q2}*NTF_2$) of FIG. 3 with the shape second quantization nose ($N_{Q2}*NTF_1*NTF_2$) of FIG. 2. The resulting analog output signal at the signal output 170 may then be sent on to a driver (DRV) that sends the analog output signal to a load such as an amplifier, speaker, resistor or the like.

In practice, a lower frequency may be used for operation of the first digital signal path 114 and first DAC 144 in MRSD-DAC 100, as compared to digital signal path 14 and DAC 44 of SD-DAC 10 in FIG. 2. This lower frequency operation may be used while achieving an equivalent or smaller OOB noise power on signal output 170 with the same LPF 160 and 60 in the output of MRSD-DAC 100 and SD-DAC 10, respectively. A lower frequency of operation in sigma-delta path 114 and first DAC 144 of MRSD-DAC 100 reduces the jitter sensitivity, which may enable achieving about 108~114 dB dynamic range with the same clock and error jitter performance used for a low-end audio DAC (e.g., 96~102 dB). Less OOB noise power may also be achieved because the low pass filter (LPF) filters out more noise when the second sigma-delta path 114 of MRSD-DAC 100 operates at a much higher frequency than the second sigma-delta path 14 of SD-DAC 10, which helps to generate a linear analog output (e.g., 80~95 dB) and good in-band noise performance (e.g., 108~114 dB) with MRSD-DAC 100. The proposed MRSD-DAC 100, therefore, may push quantization noise to higher frequencies; and, using the same low pass filter, may further reduce OOB noise power. Use of the same LPF may also save in area need on chip. For instance, in one example, the area for the DAC design is only about 0.025 mm² in a headset. The proposed MRSD-DAC may reduce cost while providing about the same performance or may achieve a higher performance at the same cost.

Figure 5:
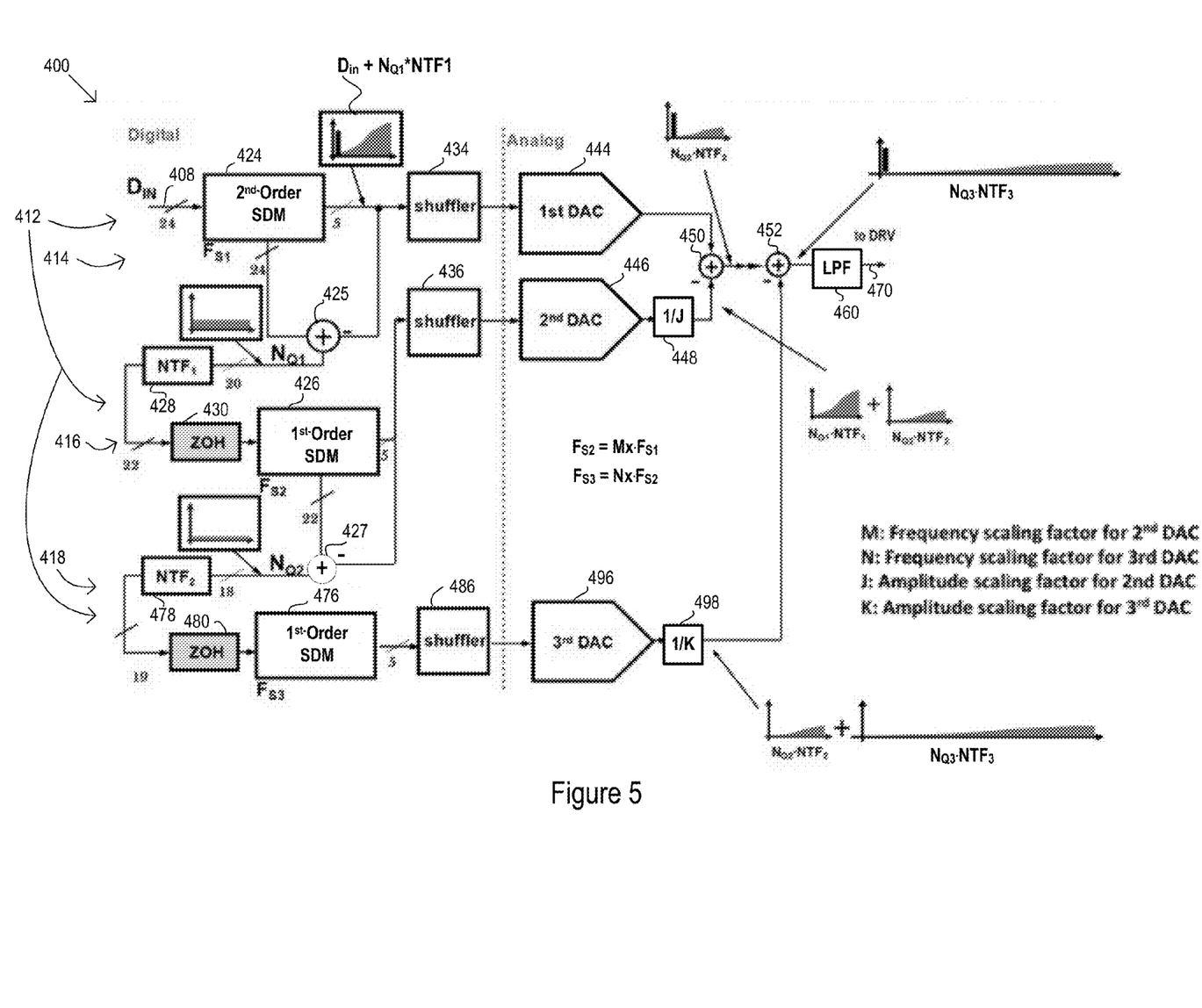
FIG. 5 is a block diagram of an example of a MRSD-DAC with three sigma delta loops.

The MRSD-DAC 100 may be used in an audio DAC for mobile phones and MP3 players, among other devices and platforms, such as in as an audio DAC for a headset and loudspeaker. The proposed MRSD-DAC may be used at two different frequencies for two DACs, but can be extended to multiple frequencies with additional DACs as shown in FIG. 5. Furthermore, while both SDMs 124 and 126 are shown as second-order modulators, the order of the SDMs 124 and 126 may be different, as will be shown in FIG. 5.

FIG. 5 is a block diagram of an example of a MRSD-DAC 400 with three digital signal paths 412 including a first digital signal path 414, a second digital signal path 416, and a third digital signal path 418. Similar to the MRSD-DAC 100 of FIG. 3, the digital signal paths 414, 416 and 418 in the MRSD-DAC 400 of FIG. 5 include respective sigma delta modulators (SDMs) 424, 426 and 476, respective shufflers 434, 436 and 486, and respective DACs 444, 446 and 496. The MRSD-DAC 400 may further include a signal input 408, a subtractor 450, a low pass filter 460 and a signal output 470.

Similarly, the first sigma delta path 414 may further include a subtractor 425, and the second sigma delta path 416 may further include a noise transfer function ($NTF_1$) filter 428 and ZOH 430 for shaping and processing the first quantization noise ($N_{Q1}$) and increasing the data rate to support a higher frequency before the shaped first quantization noise passes through the second SDM 426. The second frequency ($F_{S2}$) of the second SDM 426 is different than the first frequency ($F_{S1}$) of the first SDM 424. In the example of FIG. 5, $F_{S2}$ is shown as M times greater than $F_{S1}$. The second SDM 426 may be operated at a higher frequency where M is the frequency scaling factor for the second signal path 416 and the second DAC 446. The second sigma delta path 416, however, may also include a second subtractor 427 for producing second quantization noise generated by the second SDM 426.

At the output of the second DAC 446, a scalar 448 may scale the quantization noises from the second sigma delta path 416 by 1/K where K, an amplitude scaling factor, is the amount by which the second DAC signal is attenuated with respect to the first DAC signal in accordance with a corresponding gain factor K that is applied within the second DSM 426. The product of amplitude scaling factor K applied to the digital signal within the second SDM 426 and amplitude scaling factor K applied again as attenuation 1/K in scalar 448 to the analog signal at the output of the second DAC 446 result in unity scaling. The third signal path 418 may further include a second noise transfer function ($NTF_2$) 478 and second ZOH 480 for shaping and processing the second quantization noise received from the second SDM 426 before the shaped second quantization noise passes through the third SDM 476. At the output of the third DAC 496, a scalar 498 may scale the quantization noises from the third signal path 418 by 1/K where K is a scaling factor.

The scaling factors M and N may be a function of modulator order and the number of quantizer bits from a previous modulator. The scaling factor may be, for example, (a-b) where "a" is a quantizer bit=$\log_2$(# quantizer levels) and b is the order of the previous modulator. With a 17-level quantizer, therefore, "a" equals 4 (four) and where the previous order modulator was 2 (two), then "b" is 2 (two), making the scaling factor 2 (two). Increasing the scaling factors M, N may help increase performance but may also increase hardware complexity in increasing the number of sigma delta loops with corresponding DACs. So, M and N may be minimized with a reasonable design margin in one example. The scaling factors J and/or K may be selected responsive to a number of bits of quantization in the first and second SDM 424 and 426 and the corresponding number of bits of the first and second DACs 444 and 446. The scaling factor J and K may be proportional to the number of quantization levels, or correspondingly to $2^b$, where b is the number of bits of the SDM output data.

The first, second and third frequencies ($F_{S1}$, $F_{S2}$, $F_{S3}$) may all differ or only one may differ in that at least one of the frequencies may be higher than the other frequencies. In the example as displayed in FIG. 5, the second frequency may be the same or close to the first frequency and the third frequency may be multiple times higher than the first and second frequencies. The result is that the shaped first and second quantization noises ($N_{Q1}*NTF_1$ and $N_{Q2}*NTF_2$) may both be canceled, respectively at the subtractors 450 and 452, leaving only the third shaped quantization noise ($N_{Q3}*NTF_3$).

Because the third SDM 476 and sigma delta path 418 further reduces and pushes the quantization noise to a higher frequency than the lower frequency at which operates the first and second sigma delta paths, the third shaped quantization noise that is left with the analog output signal ($A_{out}$) contains even lower power spectral density of OOB noise. In the example of FIG. 5, therefore, the LPF 160 used in the MRSD-DAC 100 of FIG. 3 may potentially be eliminated. Sufficient low pass filtering of the quantization noise has occurred in the three sigma delta paths such that the power spectral density of the quantization noise left that is below $F_{S3}/2$ is sufficiently minimal. Removal of the LPF 160 may save space and on power consumption. Of course, the LPF 160 may optionally be included to reduce OOB noise and improve even more on the analog output performance, for high performance applications where the space and power consumption is less of a concern.

Figure 6:
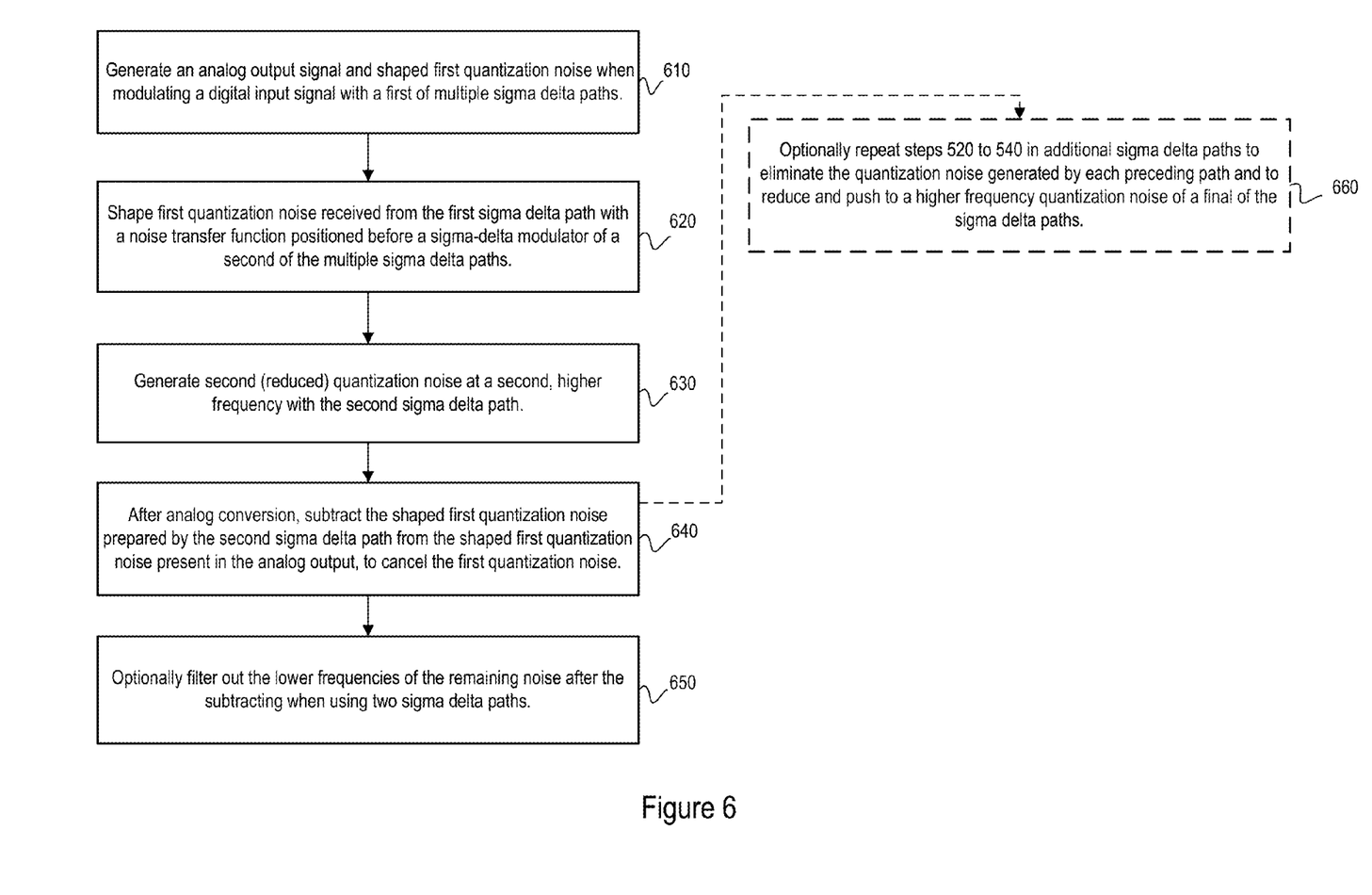
FIG. 6 is a flow chart of an example method for reducing out-of-band signal noise power in a MRSD-DAC.

FIG. 6 is a flow chart of an example method for reducing out-of-band signal noise power in a MRSD-DAC. The MRSD-DAC may be operable to generate an analog output signal and shaped first quantization noise when modulating a digital input signal with a first of multiple sigma delta paths (610). The MRSD-DAC may be further operable to shape first quantization noise received from the first sigma delta path with a noise transfer function positioned before a sigma delta modulator of a second of the multiple sigma delta paths (620). The MRSD-DAC may be further operable to generate second (reduced) quantization noise at a second, different frequency with the second sigma delta path (630).

After analog conversion, the MRSD-DAC may be further operable to subtract the shaped first quantization noise prepared by the second sigma delta path from the shaped first quantization noise in the analog output, to cancel the first quantization noise (640). The MRSD-DAC may be further operable to filter out the higher frequencies of the remaining noise after the subtracting, (650).

Optionally, the MRSD-DAC may be operable to repeat steps 620 to 640 in additional sigma delta paths to eliminate the quantization noise generated by each proceeding path and to reduce and push to a higher frequency quantization noise of a final of the sigma delta paths (660). In this case, optionally, the MRSD-DAC may be further operable to filter out the lower frequencies of the removing noise after the subtracting.

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits.

While various embodiments have been described, it will be apparent to those of ordinary skill in the art that many more embodiments and implementations are possible. Accordingly, the embodiments are not to be restricted except in light of the attached claims and their equivalents.

What is claimed is:

1. A digital-to-analog converter, comprising:
a signal input;
a signal output; and
multiple modulation paths configured to couple the signal input to the signal output, the multiple modulation paths comprising:
a first modulation path comprising a first sigma delta modulator, the first modulation path configured to convert a digital input signal on the signal input to a first analog signal; and
a second modulation path configured to operate at a higher frequency than the first modulation path, the second modulation path comprising:
a second sigma delta modulator; and
a noise transfer function filter positioned before the second sigma delta modulator, the noise transfer function filter configured to:
shape first quantization noise generated in the first modulation path,
convert the shaped first quantization noise to a second analog signal; and
combine the second analog signal with the first analog signal to generate an output analog signal at the signal output.

2. The digital-to-analog converter of claim 1, wherein the multiple modulation paths comprise a sigma delta loop.

3. The digital-to-analog converter of claim 1, wherein the noise transfer function filter comprises a subtractor configured to combine the first and second analog signals to cancel the quantization noise generated by the first modulation path.

4. The digital-to-analog converter of claim 1, wherein:
the multiple modulation paths comprise multiple sequential modulation paths; and
the second path is a final path of the multiple sequential modulation paths.

5. The digital-to-analog converter of claim 1, wherein the noise transfer function filter is configured to generate second quantization noise at the higher frequency to shape the first quantization noise.

6. The digital-to-analog converter of claim 1, wherein the first quantization noise comprises first sigma delta modulator quantization noise.

7. The digital-to-analog converter of claim 1, further comprising a low pass filter operable to reduce high frequency quantization noise in the output analog signal.

8. A digital-to-analog converter, comprising:
multiple modulation paths comprising:
a first modulation path including a first sigma delta modulator, the first modulation path configured to:
modulate a digital input signal to output an analog output signal;
generate first quantization noise and
operate at a first frequency; and
a second modulation path configured to:
operate at a second frequency higher than the first frequency; and
generate second quantization noise that is centered at the second frequency and reduced in amplitude relative to the first quantization noise;
wherein the second modulation path comprises:
a second sigma delta modulator; and
a noise transfer function filter positioned before the second sigma delta modulator, the noise transfer function filter configured to shape the first quantization noise.

9. The digital-to-analog converter of claim 8, wherein the multiple modulation paths comprise sequentially ordered modulation paths.

10. The digital-to-analog converter of claim 8, wherein the second modulation path is further operable to shape and cancel the first quantization noise.

11. The digital-to-analog converter of claim 10, further comprising a subtractor operable to subtract the shaped first quantization noise from shaped first quantization noise present in the analog output signal.

12. The digital-to-analog converter of claim 11, further comprising:
 a low pass filter positioned between the subtractor and a signal output and operable to filter the analog output signal to reduce out-of-band (OOB) noise power,
 wherein the higher second frequency reduces the OOB noise power more than if the second frequency equaled the first frequency.

13. The digital-to-analog converter of claim 8, wherein the first sigma delta modulator is of a different order than the second sigma delta modulator.

14. A method comprising:
 modulating a digital input signal by multiple modulation paths operable to generate an analog output signal from the digital input signal and to shape and cancel first quantization noise generated by the modulation;
 operating a first sigma delta modulator of a first modulation path at a first frequency;
 operating a second sigma delta modulator of a second path at a second frequency, the second frequency greater than the first; and
 shaping the first quantization noise at a noise transfer function filter positioned before the second sigma delta modulator.

15. The method of claim 14, wherein modulating the digital input signal by the multiple modulation paths comprises modulating the digital signal by the multiple modulation paths in sequence.

16. The method of claim 14, further comprising generating a first analog signal and the first quantization noise with the first sigma delta modulator.

17. The method of claim 16, further comprising
 generating second quantization noise and a second analog signal by the second sigma delta modulator, where the second quantization noise is reduced and modulated to a higher frequency when compared with the first quantization noise; and
 subtracting the shaped first quantization noise in the second analog signal from shaped first quantization noise present in the first analog signal, to cancel the shaped first quantization noise in the first analog signal.

18. The method of claim 17, wherein the first and second sigma delta modulators are of different orders.

19. The method of claim 17, further comprising:
 weighting the converted second analog signal quantization noise differently than the first analog signal to compensate for different weighting factors in the first and second sigma delta modulators.

20. The method of claim 14, wherein shaping the first quantization noise comprises generating second quantization noise at the second frequency to shift an output quantization noise of the multiple modulation paths upward in frequency.

* * * * *